United States Patent
Song

(10) Patent No.: US 12,376,316 B2
(45) Date of Patent: Jul. 29, 2025

(54) SEMICONDUCTOR DEVICE AND METHOD FOR FABRICATING THE SAME

(71) Applicant: SK hynix Inc., Icheon-si (KR)

(72) Inventor: Jeong Hwan Song, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 533 days.

(21) Appl. No.: 17/710,627

(22) Filed: Mar. 31, 2022

(65) Prior Publication Data

US 2023/0130346 A1    Apr. 27, 2023

(30) Foreign Application Priority Data

Oct. 27, 2021  (KR) .......... 10-2021-0144560

(51) Int. Cl.
*H10B 63/00*   (2023.01)
*H10N 70/00*   (2023.01)

(52) U.S. Cl.
CPC ........... *H10B 63/84* (2023.02); *H10N 70/021* (2023.02); *H10N 70/841* (2023.02)

(58) Field of Classification Search
None
See application file for complete search history.

(56) References Cited

U.S. PATENT DOCUMENTS

| | | | |
|---|---|---|---|
| 9,666,798 B1* | 5/2017 | Lee | H10B 63/80 |
| 9,960,350 B2 | 5/2018 | Ha | |
| 2020/0066340 A1* | 2/2020 | Sharma | H10N 70/046 |
| 2021/0005812 A1 | 1/2021 | Wu et al. | |
| 2021/0013408 A1 | 1/2021 | Pai et al. | |

FOREIGN PATENT DOCUMENTS

KR    20170137562 A    12/2017

\* cited by examiner

*Primary Examiner* — Asok K Sarkar
(74) *Attorney, Agent, or Firm* — Perkins Coie LLP

(57) ABSTRACT

A semiconductor device including at least one memory cell is provided. The memory cell includes: a first electrode layer; a second electrode layer; a selection element layer coupled between the first electrode layer and the second electrode layer; and an insulating layer coupled between the first electrode layer and the second electrode such that a side surface of the insulating layer is in contact with a side surface of the selection element layer, wherein the selection element layer includes an insulating material doped with a first element, and wherein the insulating layer includes the insulating material doped with the first element at a lower concentration than the selection element layer, or the insulating material not doped with the first element.

8 Claims, 8 Drawing Sheets

SEMICONDUCTOR DEVICE AND METHOD FOR FABRICATING THE SAME

CROSS-REFERENCE TO RELATED APPLICATION

This patent document claims the priority and benefits of Korean Patent Application No. 10-2021-0144560 filed on Oct. 27, 2021, which is incorporated herein by reference in its entirety.

TECHNICAL FIELD

This patent document relates to memory circuits or devices and their applications in electronic devices or systems.

BACKGROUND

Recently, electronic appliances trend toward miniaturization, low power consumption, high performance, and multi-functionality. The recent trend in the electronic appliances is leading to an increase in the use of semiconductor devices such as semiconductor memory devices to store information in various electronic appliances such as a computer and a portable communication device. Such semiconductor devices can store data using a resistance switching mechanism between different resistance values that vary depending on the voltage or current applied the semiconductor devices, for example, an RRAM (resistive random access memory), a PRAM (phase change random access memory), an FRAM (ferroelectric random access memory), an MRAM (magnetic random access memory), and an electronic fuse (E-fuse).

SUMMARY

The disclosed technology in this patent document relate to semiconductor devices that include memory cells that have excellent operating characteristics and can be manufactured using a simple manufacturing process.

In an embodiment, a semiconductor device at least one memory cell, which includes: a first electrode layer; a second electrode layer; a selection element layer coupled between the first electrode layer and the second electrode layer; and an insulating layer coupled between the first electrode layer and the second electrode such that a side surface of the insulating layer is in contact with a side surface of the selection element layer, wherein the selection element layer includes an insulating material doped with a first element, and wherein the insulating layer includes the insulating material doped with the first element at a lower concentration than the selection element layer, or the insulating material not doped with the first element.

In another embodiment, a method for fabricating a semiconductor device, includes: forming a stacked structure over a substrate, the stacked structure including a first electrode layer, a second electrode layer, and an initial selection element layer between the first electrode layer and the second electrode layer, the initial selection element layer including an insulating material doped with a first element; and forming a spacer layer in contact with a side surface of the initial selection element layer, wherein the forming of the spacer layer is performed using a precursor including a second element that reacts with the first element to remove the first element from a part of the initial selection element layer.

In another embodiment, a method for fabricating a semiconductor device, includes: forming a stacked structure over a substrate, the stacked structure including a first electrode material layer, a second electrode layer, and an initial selection element material layer between the first electrode layer and the second electrode layer, the initial selection element material layer including an insulating material doped with a first element; forming a mask pattern over the stacked structure; and etching the stacked structure using the mask pattern as an etch barrier, wherein the etching of the stacked structure is performed using an etching gas including a second element that reacts with the first element to remove the first element from a part of the initial selection element material layer.

DETAILED DESCRIPTION

Figure 1:
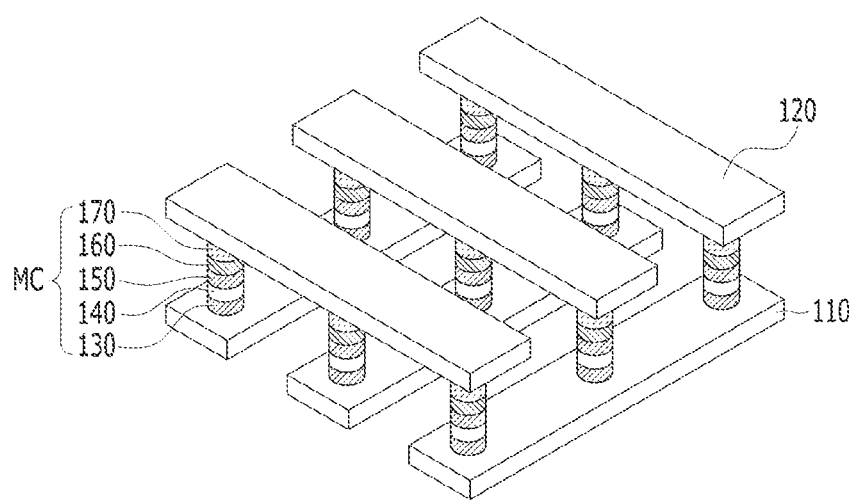
FIG. 1 is a perspective view illustrating an example of a memory device based on some embodiments of the disclosed technology.

Hereinafter, various embodiments of the disclosed technology will be described in detail with reference to the accompanying drawings.

The drawings are not necessarily drawn to scale. In some instances, proportions of at least some structures in the drawings may have been exaggerated in order to clearly illustrate certain features of the described embodiments. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIG. 1 is a perspective view illustrating an example of a memory device based on some embodiments of the disclosed technology.

Referring to FIG. 1, the memory device based on some embodiments of the disclosed technology may include a plurality of first conductive lines 110, a plurality of second conductive lines 120, and a plurality of memory cells MC.

The plurality of first conductive lines 110 may be arranged to be spaced apart from each other while extending in a first direction.

The plurality of second conductive lines 120 may be disposed over the plurality of first conductive lines 110 to be spaced apart from the plurality of first conductive lines 110. Also, the plurality of second conductive lines 120 may be arranged to be spaced apart from each other while extending in a second direction intersecting the first direction.

The plurality of memory cells MC may be interposed between the first conductive lines 110 and the second conductive lines 120, and may be arranged to overlap intersections of the first conductive lines 110 and the second conductive lines 120, respectively.

The memory cell MC may include a stacked structure of a first electrode layer 130, a selection element layer 140, a second electrode layer 150, a variable resistance layer 160, and a third electrode layer 170.

The first electrode layer 130 and the third electrode layer 170 may be located at both ends, for example, at lower and upper ends, respectively, of the memory cell MC to transmit a voltage or current required for the operation of the memory cell MC. The second electrode layer 150 may be interposed between the selection element layer 140 and the variable resistance layer 160 to physically separate them and electrically connect them. The first electrode layer 130, the second electrode layer 150, and the third electrode layer 170 may include various conductive materials, for example, a metal such as platinum (Pt), tungsten (W), aluminum (Al), copper (Cu), tantalum (Ta) and titanium (Ti), a metal nitride such as titanium nitride (TiN) and tantalum nitride (TaN), or a combination thereof. Alternatively, for example, at least one of the first electrode layer 130, the second electrode layer 150, and the third electrode layer 170 may include a carbon electrode. Alternatively, for example, at least one of the first electrode layer 130, the second electrode layer 150, and the third electrode layer 170 may be omitted.

The selection element layer 140 may function to reduce and/or suppress a leakage current between the memory cells MC sharing the first conductive line 110 or the second conductive line 120. To this end, the selection element layer 140 may have a threshold switching characteristic that blocks or substantially limits a current when a magnitude of an applied voltage is less than a predetermined threshold value and allows the current to increase rapidly. This threshold value may be referred to as a threshold voltage, and the selection element layer 140 may have either a turned-on or "on" state or a turned-off or "off" state depending on the threshold voltage.

In some embodiments of the disclosed technology, the selection element layer 140 may have a structure in which a dopant is doped in an insulating material. The insulating material for forming the selection element layer 140 may include a silicon-containing insulating material such as silicon oxide, silicon nitride, or silicon oxynitride. Alternatively, the insulating material for forming the selection element layer 140 may include insulating metal oxide, insulating metal nitride, or a combination thereof. As the insulating metal oxide, for example, aluminum oxide may be used, and as the insulating metal nitride, for example, aluminum nitride may be used.

The dopant in the selection element layer 140 is immobile and thus does not move within the insulating material, but it may play a role in creating trap sites that can trap conductive carriers migrating within the insulating material or provide a conductive path for the trapped conductive carriers to migrate again within the insulating material. When a voltage greater than or equal to the threshold voltage is applied to the selection element layer 140, the conductive carriers may move through the trap sites, and thus the selection element layer 140 is transitioned to an "on" state in which a current can flow through the selection element layer 140. On the other hand, when a voltage applied to the selection element layer 140 decreases below the threshold voltage, the conductive carriers may not move, and thus the selection element layer 140 is transitioned to an "off" state in which a current does not flow.

The dopant of the selection element layer 140 will be hereinafter referred to as a first element. In order to form the trap site as described above, various elements generating an energy level capable of accommodating the conductive carriers in the insulating material may be used as the first element. For example, when the insulating material contains silicon, the first element may include a metal having a valence different from that of silicon. Alternatively, when the insulating material contains a metal, the first element may include another metal having a valence different from that of the metal, silicon, or others. In addition, in order to implement the above immobile characteristics, the diffusivity of the first element may be relatively low. For example, when the insulating material contains silicon, the first element may include an element having low diffusivity in silicon, such as gallium (Ga), boron (B), indium (In), phosphorus (P), arsenic (As), antimony (Sb) germanium (Ge), silicon (Si), carbon (C), tungsten (W), or a combination thereof. As an example, the selection element layer 140 may include silicon oxide ($SiO_2$) doped with arsenic (As).

The variable resistance layer 160 may be a part that stores data in the memory cell MC. To this end, the variable resistance layer 160 may have a variable resistance characteristic that switches between different resistance states according to an applied voltage. When the variable resistance layer 160 is in a low resistance state, the memory cell MC may store, for example, data '1', and when the variable resistance layer 160 is in a high resistance state, the memory cell MC may store, for example, data '0'. The variable resistance layer 160 may have a single-layered structure or a multi-layered structure including at least one of materials used for an RRAM, a PRAM, an MRAM, an FRAM, or others, that is, a metal oxide such as a perovskite-based oxide or a transition metal oxide, a phase change material such as a chalcogenide-based material, a ferromagnetic material, a ferroelectric material, or others.

In an embodiment, the case in which the selection element layer 140 is located under the variable resistance layer 160 is illustrated, but the present disclosure is not limited thereto. In another embodiment, the upper and lower positions of the selection element layer 140 and the variable resistance layer 160 may be reversed.

The memory cell MC described above may have a pillar shape to be separated from the adjacent memory cell MC. In an embodiment of the disclosed technology, the memory cell MC has a cylindrical shape. In another embodiment, the memory cell MC may have a square pillar shape which has both side surfaces aligned with both side surfaces of the second conductive line 120 in the first direction and both side surfaces aligned with both side surfaces of the first conductive line 110 in the second direction. In addition, in an embodiment of the disclosed technology, the patterning of the selection element layer 140 and the variable resistance layer 160 is performed using the same mask pattern. Thus, the selection element layer 140 and the variable resistance layer 160 may have side surfaces aligned with each other. In another embodiment, the selection element layer 140 and the variable resistance layer 160 may be separately patterned, and thus may have side surfaces that are not aligned with each other.

When the selection element layer 140 is in an "on" state, a conductive path of the conductive carriers through the trap sites may be formed in the selection element layer 140. Hereinafter, such a conductive path will be referred to as a conductive filament. The conductive filament may be formed to connect between the first electrode layer 130 and the second electrode layer 150. In this case, since the conductive filaments are randomly formed in the selection element layer 140, a problem in that the threshold voltage of the selection element layer 140 varies depending on the generation position or number of conductive filaments may occur. In the embodiments to be described below, a method for reducing the threshold voltage distribution of the selection element layer 140 is proposed.

Figure 2A:
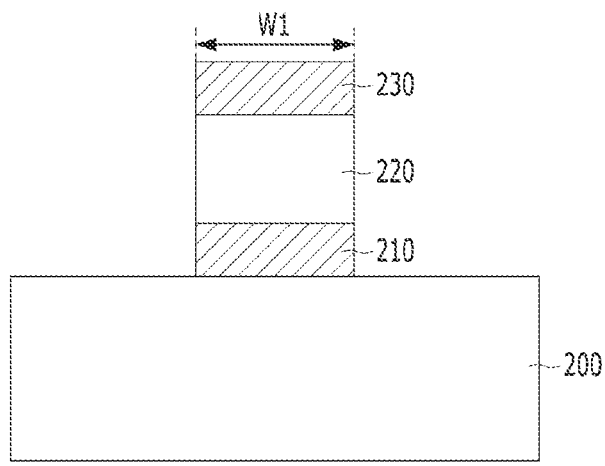
FIGS. 2A and 2B are cross-sectional views illustrating examples of a selection element layer based on some embodiments of the disclosed technology, and a method for forming the selection element layer.
Figure 2B:
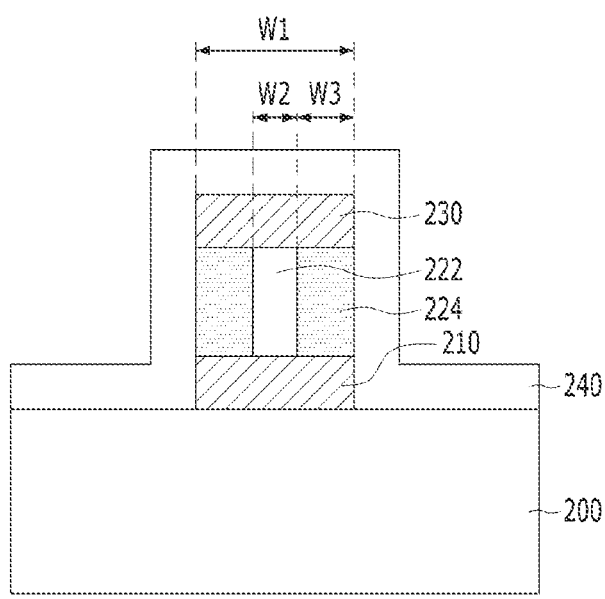

FIGS. 2A and 2B are cross-sectional views illustrating examples of a selection element layer based on some embodiments of the disclosed technology, and a method for forming the selection element layer.

First, referring to FIG. 2A, a stacked structure of a first electrode layer 210, an initial selection element layer 220, and a second electrode layer 230 may be formed over a substrate 200.

The substrate 200 may include a semiconductor material such as silicon, and may include a lower structure (not shown). For example, the substrate 200 may include a conductive line extending in one direction and having an upper surface connected to the first electrode layer 210.

The stacked structure of the first electrode layer 210, the initial selection element layer 220, and the second electrode layer 230 may be formed by sequentially depositing a conductive material for forming the first electrode layer 210, a selection element material for forming the initial selection element layer 220, and a conductive material for forming the second electrode layer 230, over the substrate 200, and then selectively etching these materials. In this case, the etching may be performed using a single mask, and accordingly, the first electrode layer 210, the initial selection element layer 220, and the second electrode layer 230 may have side surfaces aligned with each other. The stacked structure of the first electrode layer 210, the initial selection element layer 220, and the second electrode layer 230 may have a pillar shape having various planar shapes, for example, a circular shape, a square shape, or others. Based on this cross-section, the stacked structure of the first electrode layer 210, the initial selection element layer 220, and the second electrode layer 230 may have a first width W1.

The first electrode layer 210 and the second electrode layer 230 may include various conductive materials such as a metal, a metal nitride, carbon, or others.

The initial selection element layer 220 may have a structure in which a dopant is doped in an insulating material. The insulating material for forming the initial selection element layer 220 may include a silicon-containing insulating material such as silicon oxide, silicon nitride, or silicon oxynitride, insulating metal oxide, insulating metal nitride, or a combination thereof. As the dopant of the initial selection element layer 220, a first element may be used. The first element may not move within the insulating material, and may create trap sites that trap conductive carriers migrating within the insulating material or provide a conductive path for the trapped conductive carriers to migrate again within the insulating material.

In order to generate the trap sites as described above, various elements generating an energy level capable of accommodating the conductive carriers in the insulating material may be used as the first element. For example, when the insulating material contains silicon, the first element may include a metal having a valence different from that of silicon. Alternatively, when the insulating material contains a metal, the first element may include a metal having a valence different from that of the metal, silicon, or others. In addition, in order to implement the above immobile characteristics, the diffusivity of the first element may be relatively low. For example, when the insulating material contains silicon, the first element may include an element having low diffusivity in silicon, for example, gallium (Ga), boron (B), indium (In), phosphorus (P), arsenic (As), antimony (Sb), germanium (Ge), silicon (Si), carbon (C), tungsten (W), or a combination thereof.

As an example, the initial selection element layer 220 may include silicon oxide ($SiO_2$) doped with arsenic (As).

Referring to FIG. 2B, a spacer layer 240 may be formed over the process resultant structure of FIG. 2.

The spacer layer 240 may include various insulating materials such as silicon nitride, silicon oxide, or a combination thereof, and may be formed by a deposition method such as PVD (Physical Vapor Deposition), CVD (Chemical Vapor Deposition), or ALD (Atomic Layer Deposition). In addition, the spacer layer 240 may be conformally formed along its lower profile. In an embodiment, the spacer layer 240 is formed over the entire surface of the process resultant structure of FIG. 2A, but the present disclosure is not limited thereto. The spacer layer 240 may have any shape as long as the spacer layer 240 is in physical contact with at least the side surface of the initial selection element layer 220.

In an embodiment, when the spacer layer 240 is deposited, a precursor including a second element capable of removing the first element by reacting with the first element of the initial selection element layer 220 may be used. When the second element reacts with the first element, the first element may be lost from the initial selection element layer 220. As an example, when the initial selection element layer 220 includes silicon oxide doped with arsenic (As), the spacer layer 240 may be deposited using a chlorine (Cl)-based precursor. In this case, arsenic (As) may be lost in silicon oxide by reacting the chlorine (Cl)-based material included in the precursor with arsenic (As).

The loss of the first element, for example, arsenic (As) may start from the side surface of the initial selection element layer 220 in contact with the spacer layer 240, and may proceed toward the center of the initial selection element layer 220 in the horizontal direction. Accordingly, a portion of the initial selection element layer 220 may be transformed into an insulating material in which the first element is lost, for example, silicon oxide in which arsenic (As) is lost. The portion of the initial selection element layer 220 will be referred to as an insulating layer 224 hereinafter. Since the insulating layer 224 does not have trap sites sufficient to allow the conductive carriers to move due to the loss of the first element, it may no longer have a threshold switching characteristic and may have an insulating characteristic. On the other hand, the rest of the initial selection element layer 220, except for the insulating layer 224, may be maintained with the same material as the initial selection element layer 220. The rest of the initial selection element layer 220 will be hereinafter referred to as the selection element layer 222. Since the selection element layer 222 does not lose the first element, the threshold switching characteristic may be maintained. When the selection element layer 222 includes the insulating material doped with the first element at a first doping concentration, the insulating layer 224 may include the insulating material doped with the first element at a second doping concentration lower than the first doping concentration, or the insulating material that does not include the first element. For example, when the selection element layer 222 includes silicon oxide doped with arsenic (As) at a first doping concentration, the insulating layer 224 may include silicon oxide doped with arsenic (As) at a second doping concentration lower than the first doping concentration, or undoped silicon oxide. at least a portion of the insulating layer 224 may include a combination of a chlorine (Cl)-based material and arsenic (As).

In this cross-sectional view, it is illustrated that the insulating layers 224 are in contact with both side surfaces of the selection element layer 222, but the present disclosure is not limited thereto. When the stacked structure of the first electrode layer 210, the initial selection element layer 220, and the second electrode layer 230 has a pillar shape, the first element may be lost from the entire side surface of the initial selection element layer 220, so the insulating layer 224 may be formed to have a shape surrounding the side surface of the selection element layer 222.

Figure 2C:
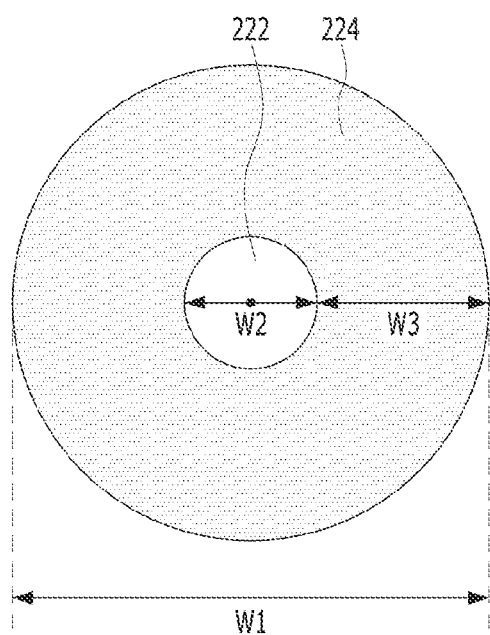
FIG. 2C is a plan view of the selection element layer 222 and the insulating layer 224 of FIG. 2B as viewed from above.

FIG. 2C is a plan view of the selection element layer 222 and the insulating layer 224 of FIG. 2B as viewed from above.

Referring to FIG. 2C, the selection element layer 222 may have a circular shape in a plan view, and the insulating layer 224 may have a circular ring shape surrounding the selection element layer 222. This may correspond to a case in which the initial selection element layer 220 of FIG. 2A has a cylindrical shape. However, the present disclosure is not limited thereto, and the selection element layer 222 may have various shapes such as a square shape in a plan view, and the insulating layer 224 may have various ring shapes surrounding the selection element layer 222.

In a plan view, over a line passing through the center of the selection element layer 222, the selection element layer 222 may have a second width W2, and the insulating layer 224 may have a third width W3. When the selection element layer 222 has a circular shape in a plan view, the second width W2 may correspond to the diameter of the selection element layer 222, and the third width W3 may correspond to the distance between the inner diameter and the outer diameter of the insulating layer 224. The second width W2+the third width W3*2 may be the same as the above-described first width W1. Accordingly, the second width W2 of the selection element layer 222 and the third width W3 of the insulating layer 224 may have a smaller value than the first width W1 of each of the first electrode layer 210 and the second electrode layer 230.

Referring back to FIG. 2B, the third width W3 of the insulating layer 224 may increase as at least one of the amount of the second element, for example, a chlorine (Cl)-based material used in the deposition of the spacer layer 240, the deposition time of the spacer layer 240, the deposition thickness of the spacer layer 240, and/or the deposition temperature of the spacer layer 240 increases. As the third width W3 of the insulating layer 224 increases, the second width W2 of the selection element layer 222 may decrease.

The second width W2 of the selection element layer 222 formed as a result of this process may be smaller than the first width W1 of the initial selection element layer 220. Since the conductive path of the conductive carriers through the trap sites, that is, the conductive filament is formed only in the selection element layer 222 and not in the insulating layer 224, the region where the conductive filament is generated may be limited compared to the initial selection element layer 220. As a result, compared to the initial selection element layer 220, the threshold voltage distribution of the selection element layer 222 may be reduced.

Although not shown, a variable resistance layer may be formed to be connected to the first electrode layer 210 under the first electrode layer 210, or may be formed to be connected to the second electrode layer 230 over the second electrode layer 230. When the variable resistance layer is positioned under the first electrode layer 210, it may be in a state formed within the substrate 200. When the variable resistance layer is positioned over the second electrode layer 230, a portion of the spacer layer 240 present on the second electrode layer 230 may be removed for connection with the second electrode layer 230. Accordingly, it may be possible to implement a memory cell in which the selection element layer 222 and the variable resistance layer are connected in series.

Figure 3A:
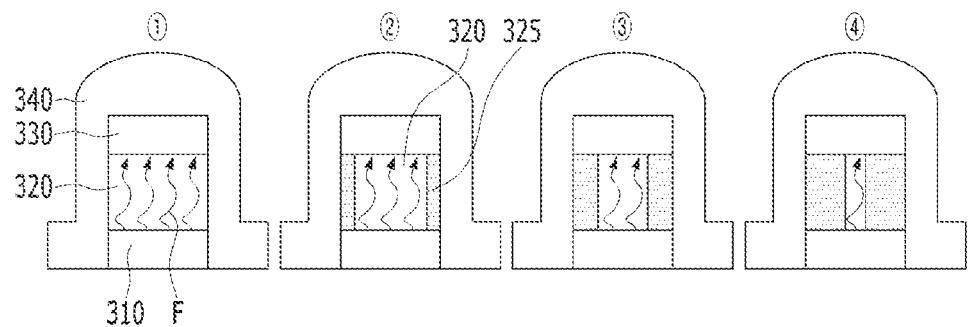
FIG. 3A is a cross-sectional view illustrating different selection element layers having different widths.
Figure 3B:
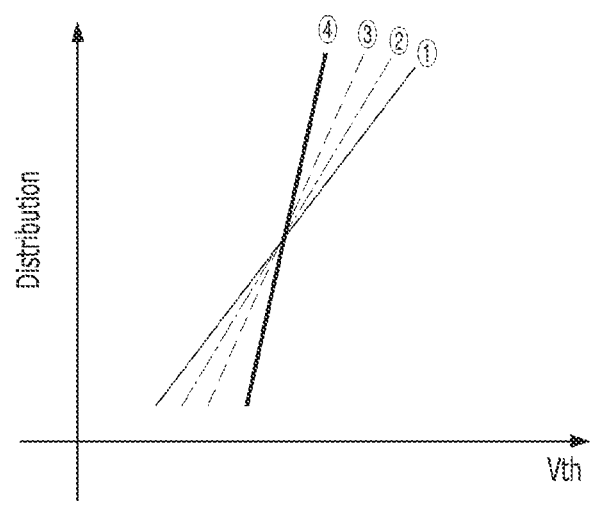
FIG. 3B is a diagram illustrating threshold voltages of the different selection element layers having the different widths.

FIG. 3A is a cross-sectional view illustrating different selection element layers having different widths, and FIG. 3B is a diagram illustrating threshold voltages of the different selection element layers having the different widths.

Referring to FIG. 3A, first to fourth cases (see ① to ④) are shown. In these cases, a stacked structure having a selection element layer 320 interposed between the first electrode layer 310 and the second electrode layer 330 may be formed, and a spacer layer 340 may be formed over the stacked structure.

In the first case, a precursor used for depositing the spacer layer 340 may not contain any element that reacts with the first element of the selection element layer 320 to remove or cause loss of the first element. In this case, the selection element layer 320 may have the same width as the first electrode layer 310 and the second electrode layer 330, and the side surface of the selection element layer 320 may be aligned with the side surfaces of the first electrode layer 310 and the second electrode layer 330.

In the second case, a precursor used for depositing the spacer layer 340 may include a second element that reacts with the first element of the selection element layer 320 to remove or cause loss of the first element. In this case, the selection element layer 320 may have a width smaller than that of the first electrode layer 310 and the second electrode layer 330, and the side surface of the selection element layer 320 may be surrounded by the insulating layer 325. The inner side surface of the insulating layer 325 may be in contact with the side surface of the selection element layer 320, and the outer side surface of the insulating layer 325 may be aligned with the side surfaces of the first electrode layer 310 and the second electrode layer 330.

In the third case, a precursor used for depositing the spacer layer 340 may include the second element, but the content of the second element may be greater than that in the second case. Alternatively, at least one of the deposition time, the deposition thickness, and the deposition temperature of the spacer layer 340 may be greater than that in the second case. In this case, the selection element layer 320 may have a width smaller than that of the first electrode layer 310 and the second electrode layer 330, but may have a smaller width than that of the second case. As a result, the width of the insulating layer 325 surrounding the side surface of the selection element layer 320 may increase compared to the second case.

In the fourth case, a precursor used for depositing the spacer layer 340 may include the second element, but the content of the second element may be greater than that in the third case. Alternatively, at least one of the deposition time, the deposition thickness, and the deposition temperature of the spacer layer 340 may be greater than in the third case. In this case, the selection element layer 320 may have a width smaller than that of the first electrode layer 310 and the second electrode layer 330, but may have a smaller width than that of the third case. As a result, the width of the insulating layer 325 surrounding the side surface of the selection element layer 320 may increase compared to the third case.

From the first case to the fourth case, since the width of the selection element layer 320 decreases, the number and/or density of the conductive filaments F formed in the selection element layer 320 may decrease. As a result, the threshold voltage distribution of the selection element layer 320 may be reduced. This is also shown in the graph of FIG. 3B.

Referring to FIG. 3B, it is shown that the threshold voltage distribution of the selection element layer 320 decreases from the first case to the fourth case.

In the above embodiment, the selection element layer may be patterned separately from the variable resistance layer, but the present disclosure is not limited thereto. In another embodiment, the selection element layer and the variable resistance layer may be collectively patterned using a single mask.

Figure 4A:
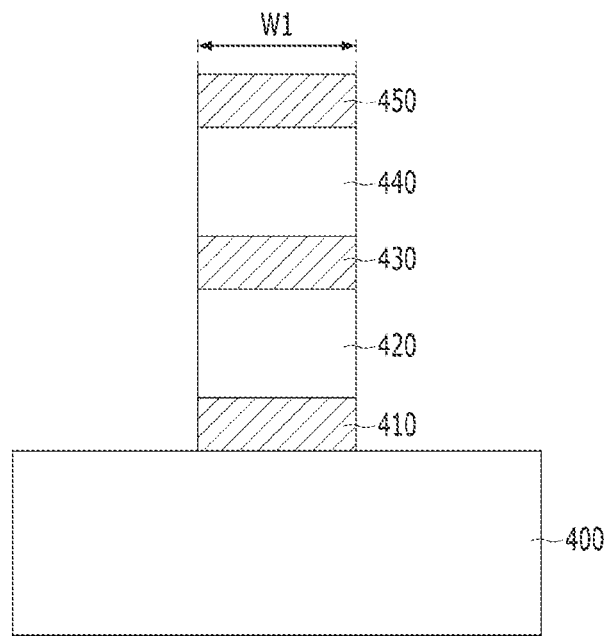
FIGS. 4A and 4B are cross-sectional views illustrating a memory cell based on some embodiments of the disclosed technology and a method for forming the memory cell.
Figure 4B:
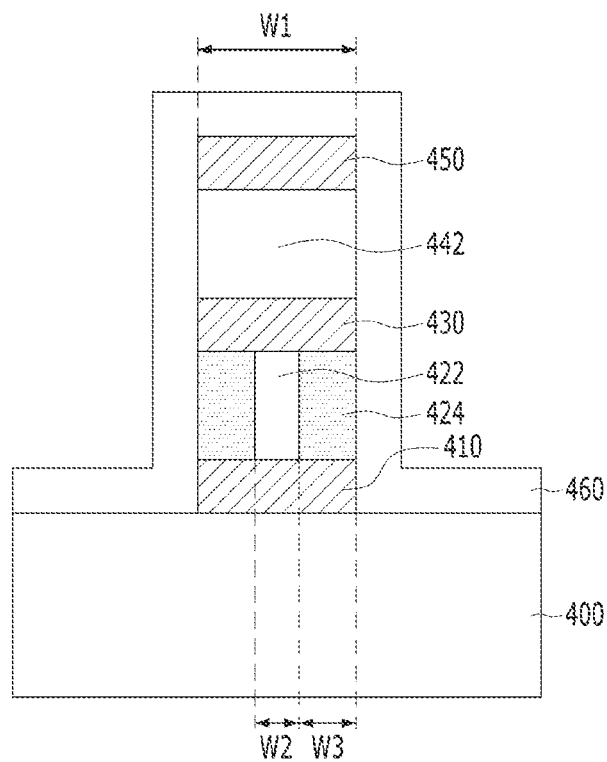

FIGS. 4A and 4B are cross-sectional views illustrating a memory cell based on some embodiments of the disclosed technology, and a method for forming the memory cell. Differences from the above-described embodiment of FIGS. 2A and 2B will be mainly described.

Referring to FIG. 4A, a stacked structure of a first electrode layer 410, an initial selection element layer 420, a second electrode layer 430, an initial variable resistance layer 440, and a third electrode layer 450 may be formed over a substrate 400.

The stacked structure of the first electrode layer 410, the initial selection element layer 420, the second electrode layer 430, the initial variable resistance layer 440, and the third electrode layer 450 may be formed by sequentially depositing a conductive material for forming the first electrode layer 410, a selection element material for forming the initial selection element layer 420, a conductive material for forming the second electrode layer 430, a variable resistance material for forming the initial variable resistance layer 440, and a conductive material for forming the third electrode layer 450, over the substrate 400, and then selectively etching these materials. In this case, the etching may be performed using one mask, and accordingly, the first electrode layer 410, the initial selection element layer 420, the second electrode layer 430, the initial variable resistance layer 440, and the third electrode layer 450 may have side surfaces aligned with each other. Based on this cross-section, the stacked structure of the first electrode layer 410, the initial selection element layer 420, the second electrode layer 430, the initial variable resistance layer 440, and the third electrode layer 450 may have a first width W1.

The initial selection element layer 420 may have a structure in which a first element is doped in an insulating material. As an example, the initial selection element layer 420 may include silicon oxide ($SiO_2$) doped with arsenic (As).

The initial variable resistance layer 440 may include various materials having variable resistance characteristics. For example, the initial variable resistance layer 440 may have a single-layered structure or a multi-layered structure including various materials used in RRAM, PRAM, FRAM, or MRAM, for example, a metal oxide such as a transition metal oxide or a perovskite-based material, a phase change material such as a chalcogenide-based material, a ferroelectric material, a ferromagnetic material, or others.

Referring to FIG. 4B, a spacer layer 460 may be formed over the process resultant structure of FIG. 4A.

When the spacer layer 460 is deposited, a precursor including a second element capable of removing the first element by reacting with the first element of the initial selection element layer 420 may be used. For example, when the initial selection element layer 420 includes silicon oxide doped with arsenic (As), a chlorine (Cl)-based precursor may be used.

As a result, a portion from the side surface of the initial selection element layer 420 may be transformed into an insulating material in which the first element is lost, for example, silicon oxide in which arsenic (As) is lost. The portion of the initial selection element layer 420 will be hereinafter referred to as an insulating layer 424. The rest of the initial selection element layer 420, except for the insulating layer 424, may be maintained with the same material as the initial selection element layer 420. The rest of the initial selection element layer 420 will be referred to as a selection element layer 422. Since the second width W2 of the selection element layer 422 is smaller than the first width W1 of the initial selection element layer 420, the conductive filament formation region may be limited, so that the threshold voltage distribution of the selection element layer 422 may decrease. The insulating layer 424 may have a third width W3.

The spacer layer 460 may also contact the side surface of the initial variable resistance layer 440, and accordingly, the initial variable resistance layer 440 may or may not be affected by the precursor used in depositing the spacer layer 460 depending on the material of the initial variable resistance layer 440. That is, when the spacer layer 460 is deposited, a portion of the variable resistance layer 440 may or may not be deformed or transformed from the side surface of the initial variable resistance layer 440. However, since this is a part irrelevant to the characteristics of the present disclosure, a detailed description thereof will be omitted. The initial variable resistance layer 440 after the spacer layer 460 is deposited will be referred to as a variable resistance layer 442. The variable resistance layer 442 may include the same material as the initial variable resistance layer 440, or a portion of the side surface of the initial variable resistance layer 440 may have a deformed or transformed state.

In an embodiment, the case where the selection element layer 422 is positioned under the variable resistance layer 442 is illustrated, but the present disclosure is not limited thereto. In another embodiment, the selection element layer 422 may be formed over the variable resistance layer 442.

Figure 5A:
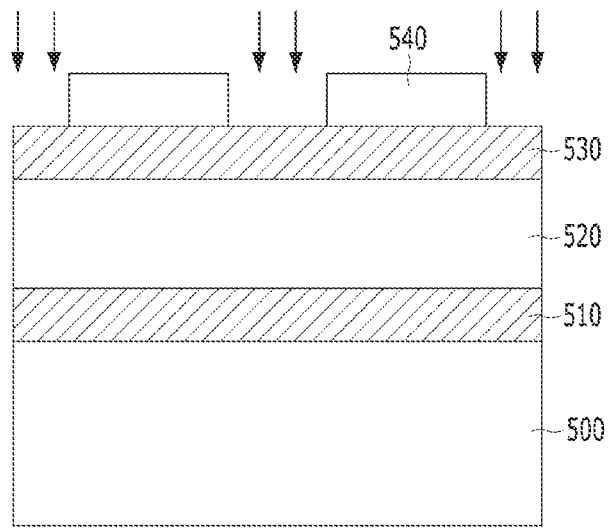
FIGS. 5A and 5B are cross-sectional views illustrating a selection element layer based on other embodiments of the disclosed technology and a method for forming the selection element layer.
Figure 5B:
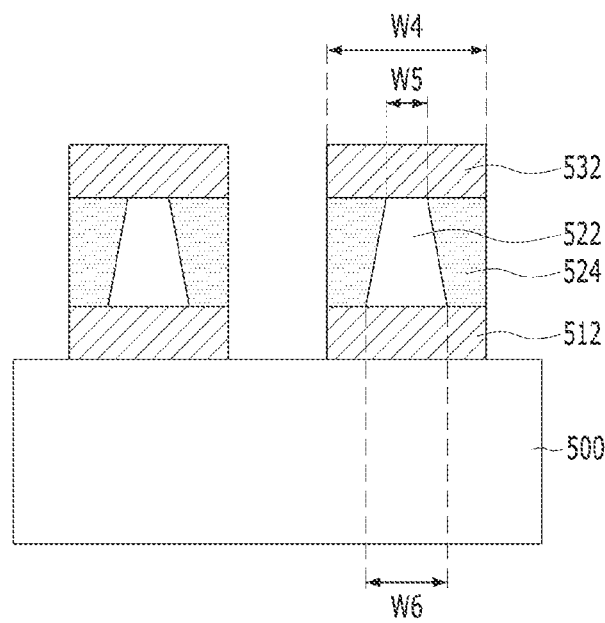

FIGS. 5A and 5B are cross-sectional views illustrating a selection element layer based on other embodiments of the disclosed technology and a method for forming the selection element layer.

Referring to FIG. 5A, a stacked structure of a first electrode material layer 510, an initial selection element material layer 520, and a second electrode material layer 530 may be formed over a substrate 500.

The first electrode material layer 510, the initial selection element material layer 520, and the second electrode material layer 530 may be layers before being patterned, and may be formed by various deposition methods.

The first electrode material layer 510 and the second electrode material layer 530 may include various conductive materials such as a metal, a metal nitride, or carbon.

The initial selection element material layer 520 may have a structure in which a first element is doped in an insulating material. As an example, the initial selection element material layer 520 may include silicon oxide ($SiO_2$) doped with arsenic (As).

Subsequently, a mask pattern 540 for patterning the stacked structure of the first electrode material layer 510, the initial selection element material layer 520, and the second electrode material layer 530 may be formed over the stacked structure.

Subsequently, the stacked structure of the first electrode material layer 510, the initial selection element material layer 520, and the second electrode material layer 530 may be etched using the mask pattern 540 as an etch barrier.

This etching process may be performed by an anisotropic etching, for example, a dry etching, in an arrow direction. In addition, in the present etching process, an etching gas including a second element capable of removing the first element by reacting with the first element of the initial selection element material layer 520 may be used. As an example, when the initial selection element material layer 520 includes silicon oxide doped with arsenic (As), a chlorine (Cl)-based etching gas may be used. For example, reactive ion etching (RIE) using chlorine gas may be performed. In this case, arsenic (As) may be lost in the silicon oxide because chlorine (Cl) included in the etching gas reacts with arsenic (As).

During the present etching process, the loss of the first element may start from the side surface formed by the etching of the initial selection element material layer 520. The resultant structure is shown in FIB. 5B.

Referring to FIG. 5B, the first electrode material layer 510 and the second electrode material layer 530 may be etched to form a first electrode layer 512 and a second electrode layer 532, respectively. In addition, the initial selection element material layer 520 may be etched to form a selection element layer 522 and an insulating layer 524 surrounding the side surface thereof.

The insulating layer 524 may be formed of a material in which the first element, for example, arsenic (As) is lost in the initial selection element material layer 520. The selection element layer 522 may be formed of the same material as the initial selection element material layer 520 without loss of the first element. When the selection element layer 522 includes the insulating material doped with the first element at a first doping concentration, the insulating layer 524 may include the insulating material doped with the first element at a second doping concentration lower than the first doping concentration, or the insulating material that does not include the first element. For example, when the selection element layer 522 includes silicon oxide doped with arsenic (As) at a first doping concentration, the insulating layer 524 may include silicon oxide doped with arsenic (As) at a second doping concentration lower than the first doping concentration, or undoped silicon oxide.

In this case, the insulating layer 524 may have a width that decreases from top to bottom. It may be because a side surface formed first by the etching, for example, an upper side surface is exposed to the etching gas longer than a side surface formed later by the etching, for example, a lower side surface, as the loss of the first element during the etching proceeds from the side surface formed by the etching of the initial selection element material layer 520 toward the inside. The inner side surface of the insulating layer 524 may be in contact with the side surface of the selection element layer 522, and the outer side surface of the insulating layer 524 may be aligned with the side surfaces of the first electrode layer 512 and the second electrode layer 532.

Accordingly, the selection element layer 522 may have a width that increases from top to bottom. The width W5 of the uppermost portion of the selection element layer 522 may be smaller than the width W6 of the lowermost portion of the selection element layer 522. However, each of the width W5 and the width W6 of the selection element layer 522 may be smaller than the width W4 of each of the first electrode layer 512 and the second electrode layer 532.

The width W5 of the uppermost portion and the width W6 of the lowermost portion of the selection element layer 522 may decrease as the amount of the etching gas including the second element, for example, chlorine (Cl), increases, or the etching time increases.

Since the width W5 of the uppermost portion and the width W6 of the lowermost portion of the selection element layer 522 are smaller than the width W4 of the first electrode layer 512 and the second electrode layer 532, and the conductive filament is formed only in the selection element layer 522, the threshold voltage distribution of the selection element layer 522 may be reduced.

Although not shown, the variable resistance layer may be formed to be connected to the first electrode layer 512 under the first electrode layer 512, or may be formed to be connected to the second electrode layer 532 over the second electrode layer 532.

Figure 6A:
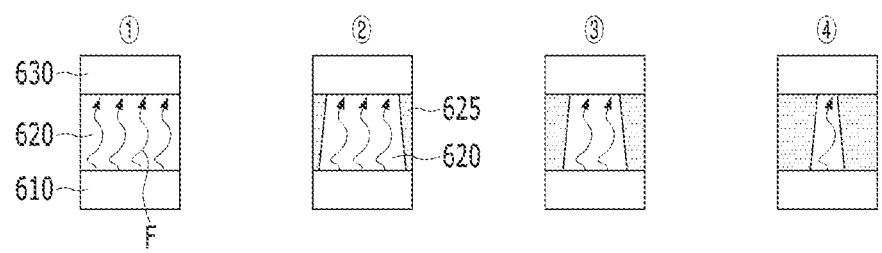
FIG. 6A is a cross-sectional view illustrating different selection element layers having different shapes and widths.
Figure 6B:
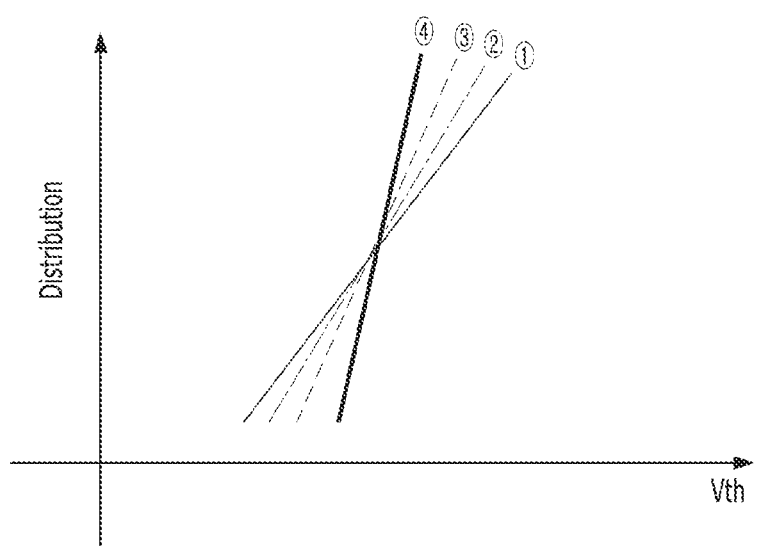
FIG. 6B is a diagram illustrating threshold voltages of the different selection element layer.

FIG. 6A is a cross-sectional view illustrating different selection element layers having different shapes and widths, and FIG. 6B is a diagram illustrating threshold voltages of the different selection element layer.

Referring to FIG. 6A, first to fourth cases (see ① to ④) are shown. In these cases, a stacked structure having a selection element layer 620 interposed between the first electrode layer 610 and the second electrode layer 630 may be formed.

In the first case, an etching gas used for the stacked structure of the first electrode layer 610, the selection element layer 620, and the second electrode layer 630 may not contain any element that reacts with the first element of the selection element layer 620 to remove or cause loss of the first element. In this case, the selection element layer 620 may have the same width as the first electrode layer 610 and the second electrode layer 630, and the side surface of the selection element layer 620 may be aligned with the side surfaces of the first electrode layer 610 and the second electrode layer 630.

In the second case, an etching gas may include a second element that reacts with the first element of the selection element layer 620 to remove or cause loss of the first element. In this case, the selection element layer 620 may have a width smaller than that of the first electrode layer 610 and the second electrode layer 630, and the side surface of the selection element layer 620 may be surrounded by the insulating layer 625. The inner side surface of the insulating layer 625 may be in contact with the side surface of the selection element layer 620, and the outer side surface of the insulating layer 625 may be aligned with the side surfaces of the first electrode layer 610 and the second electrode layer 630. The selection element layer 620 may have a width that increases from top to bottom, and accordingly, the insulating layer 625 may have a width that decreases from top to bottom.

In the third case, an etching gas including the second element may be used, but the flow rate of the etching gas may be greater than that in the second case. Alternatively, the etching time may be greater than that in the second case. In this case, the selection element layer 620 may have a width smaller than that of the first electrode layer 610 and the second electrode layer 630, but may have a smaller width than that of the second case. As a result, the width of the insulating layer 625 surrounding the side surface of the selection element layer 620 may increase compared to the second case.

In the fourth case, an etching gas including the second element may be used, but the flow rate of the etching gas may be greater than that in the third case. Alternatively, the etching time may be greater than that in the third case. In this case, the selection element layer 620 may have a width smaller than that of the first electrode layer 610 and the second electrode layer 630, but may have a smaller width than that of the third case. As a result, the width of the insulating layer 625 surrounding the side surface of the selection element layer 620 may increase compared to the third case.

From the first case to the fourth case, since the width of the selection element layer 620 decreases, the number and/or density of the conductive filaments F formed in the selection element layer 620 may decrease. As a result, the threshold voltage distribution of the selection element layer 620 may be reduced. This is also shown in the graph of FIG. 6B.

Referring to FIG. 6B, it is shown that the threshold voltage distribution of the selection element layer 620 decreases from the first case to the fourth case.

In the above embodiment, the selection element layer may be patterned separately from the variable resistance layer, but the present disclosure is not limited thereto. In another embodiment, the selection element layer and the variable resistance layer may be collectively patterned using a single mask.

Figure 7A:
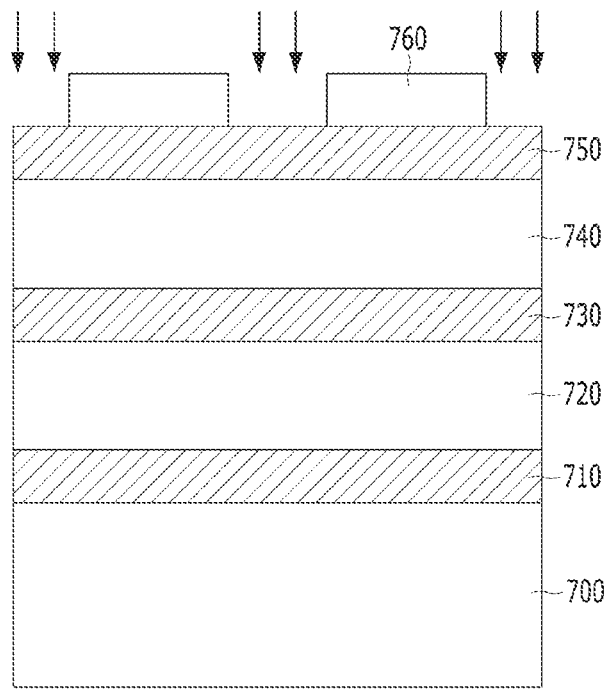
FIGS. 7A and 7B are cross-sectional views illustrating a memory cell based on other embodiments of the disclosed technology and a method for forming the memory cell.
Figure 7B:
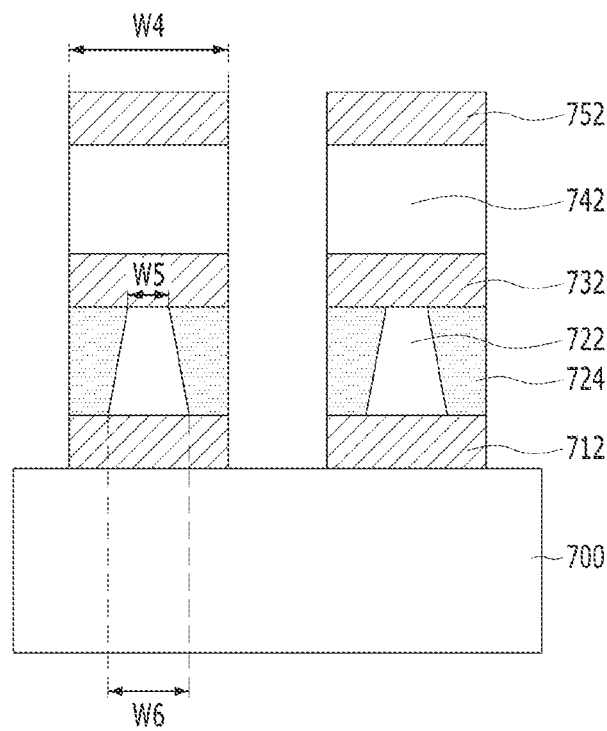

FIGS. 7A and 7B are cross-sectional views illustrating a memory cell based on some embodiments of the disclosed technology, and a method for forming the memory cell. Differences from the above-described embodiment of FIGS. 5A and 5B will be mainly described.

Referring to FIG. 7A, a stacked structure of a first electrode material layer 710, an initial selection element material layer 720, a second electrode material layer 730, an initial variable resistance material layer 740, and a third electrode material layer 750 may be formed over a substrate 700.

The initial selection element material layer 720 may have a structure in which a first element is doped in an insulating material. As an example, the initial selection element material layer 720 may include silicon oxide ($SiO_2$) doped with arsenic (As).

The initial variable resistance material layer 740 may include various materials having variable resistance characteristics. For example, the initial variable resistance material layer 740 may have a single-layered structure or a multi-layered structure including various materials used in RRAM, PRAM, FRAM, or MRAM, for example, a metal oxide such as a transition metal oxide or a perovskite-based material, a phase change material such as a chalcogenide-based material, a ferroelectric material, a ferromagnetic material, or others.

Subsequently, the stacked structure of the first electrode material layer 710, the initial selection element material layer 720, the second electrode material layer 730, the initial variable resistance material layer 740, and the third electrode material layer 750 may be etched using a mask pattern as an etch barrier.

This etching process may be performed by an anisotropic etching, for example, a dry etching, in an arrow direction. In addition, in the present etching process, an etching gas including a second element capable of removing the first element by reacting with the first element of the initial selection element material layer 720 may be used. As an example, when the initial selection element material layer 720 includes silicon oxide doped with arsenic (As), a chlorine (Cl)-based etching gas may be used. The resultant structure is shown in FIB. 7B.

Referring to FIG. 7B, the first electrode material layer 710, the second electrode material layer 730, the initial variable resistance material layer 740, and the third electrode material layer 750 may be etched to form a first electrode layer 712, a second electrode layer 732, a variable resistance layer 742, and a third electrode layer 752, respectively. In addition, the initial selection element material layer 720 may be etched to form a selection element layer 722 and an insulating layer 724 surrounding the side surface thereof.

The insulating layer 724 may be formed of a material in which the first element, for example, arsenic (As) is lost in the initial selection element material layer 720.

In this case, the insulating layer 724 may have a width that decreases from top to bottom. The inner side surface of the insulating layer 724 may be in contact with the side surface of the selection element layer 722, and the outer side surface of the insulating layer 724 may be aligned with the side surfaces of the first electrode layer 712 and the second electrode layer 732. Accordingly, the selection element layer 722 may have a width that increases from top to bottom. The width W5 of the uppermost portion of the selection element layer 722 may be smaller than the width W6 of the lowermost portion of the selection element layer 722. However, each of the width W5 and the width W6 of the selection element layer 722 may be smaller than the width W4 of each of the first electrode layer 712 and the second electrode layer 732.

During the etching, the side surface of the initial variable resistance material layer 740 may be exposed to the etching gas. Accordingly, the initial variable resistance material layer 740 may or may not be affected by the etching gas depending on the material of the initial variable resistance material layer 740. That is, a portion from the side surface of the variable resistance layer 742, formed by the etching, may or may not be deformed or transformed. However, since this is a part irrelevant to the characteristics of the present disclosure, a detailed description thereof will be omitted. The variable resistance layer 742 may include the same material as the initial variable resistance material layer 740, or a portion from the side surface of the variable resistance layer 742 may have a deformed or transformed material different from the initial variable resistance material layer 740.

In an embodiment, the case where the selection element layer 722 is positioned under the variable resistance layer 742 is illustrated, but the present disclosure is not limited thereto. In another embodiment, the selection element layer 722 may be formed over the variable resistance layer 742.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can in some cases be excised from the combination, and the claimed combination may be directed to a sub combination or variation of a sub combination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few embodiments and examples are described. Other embodiments, enhancements and variations can be made based on what is described and illustrated in this patent document.

What is claimed is:

1. A semiconductor device including at least one memory cell, the memory cell comprising:
    a first electrode layer;
    a second electrode layer;
    a selection element layer coupled between the first electrode layer and the second electrode layer; and
    an insulating layer coupled between the first electrode layer and the second electrode such that a side surface of the insulating layer is in contact with a side surface of the selection element layer,
    wherein the selection element layer includes a first silicon oxide layer doped with arsenic, and
    wherein the insulating layer includes a second silicon oxide layer doped with a combination of arsenic and chlorine.

2. The semiconductor device according to claim 1, wherein a width of the selection element layer is smaller than a width of the first electrode layer or the second electrode layer.

3. The semiconductor device according to claim 1, wherein the insulating layer includes an inner side surface structured to surround the side surface of the selection element layer.

4. The semiconductor device according to claim 3, wherein the insulating layer includes an outer side surface that is aligned with side surfaces of the first electrode layer and the second electrode layer.

5. The semiconductor device according to claim 1, wherein the selection element layer includes a first end in contact with the first electrode layer and a second end in contact with the second electrode layer, and wherein a width of the first end is larger than a width of the second end.

6. The semiconductor device according to claim 5, wherein the insulating layer includes a first end in contact with the first electrode layer and a second end in contact with the second electrode layer, and wherein a width of the first end is smaller than a width of the second end.

7. The semiconductor device according to claim 1, wherein the memory cell further comprising:
    a spacer layer in contact with a side surface of the insulating layer.

8. The semiconductor device according to claim 1, wherein the memory cell further comprising:
    a variable resistance layer connected to the first electrode layer or the second electrode layer.

* * * * *